United States Patent
Sharma

(10) Patent No.: US 8,450,600 B2
(45) Date of Patent: May 28, 2013

(54) PHOTOVOLTAIC DEVICE WITH SCRATCH-RESISTANT COATING

(75) Inventor: Pramod K. Sharma, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 337 days.

(21) Appl. No.: 12/801,849

(22) Filed: Jun. 29, 2010

(65) Prior Publication Data

US 2010/0269901 A1 Oct. 28, 2010

Related U.S. Application Data

(62) Division of application No. 11/716,034, filed on Mar. 9, 2007, now Pat. No. 7,767,253.

(51) Int. Cl.
*H01L 31/00* (2006.01)
*B32B 9/04* (2006.01)

(52) U.S. Cl.
USPC ............................................ 136/256; 428/447

(58) Field of Classification Search
USPC ............................................ 136/256; 428/447
See application file for complete search history.

(56) References Cited

U.S. PATENT DOCUMENTS

| | | |
|---|---|---|
| 4,389,534 A | 6/1983 | Winterling |
| 4,510,344 A | 4/1985 | Berman |
| 4,528,418 A | 7/1985 | McGill |
| 4,792,536 A | 12/1988 | Pecoraro et al. |
| 4,806,436 A | 2/1989 | Tada et al. |
| 4,816,333 A | 3/1989 | Lange et al. |
| 4,830,879 A | 5/1989 | Debsikdar |
| 5,171,411 A | 12/1992 | Hillendahl et al. |
| 5,214,008 A | 5/1993 | Beckwith et al. |
| 5,326,519 A | 7/1994 | Claussen |
| 5,401,287 A | 3/1995 | Pecoraro et al. |

(Continued)

FOREIGN PATENT DOCUMENTS

| | | |
|---|---|---|
| DE | 103 29 917 | 2/2005 |
| EP | 1 167 313 | 1/2002 |

(Continued)

OTHER PUBLICATIONS

U.S. Appl. No. 11/716,034, filed Mar. 9, 2007; Sharma.

(Continued)

*Primary Examiner* — Jonathan Johnson
*Assistant Examiner* — Allison Bourke
(74) *Attorney, Agent, or Firm* — Nixon & Vanderhye P.C.

(57) ABSTRACT

A method of making an anti-reflection coating using a sol-gel process, for use in a photovoltaic device or the like. The method may include the following steps in certain example embodiments: forming a polymeric component of silica by mixing silane(s) with one or more of a first solvent, a catalyst, and water; forming a silica sol gel by mixing the polymeric component with a colloidal silica, and optionally a second solvent; forming a metal oxide sol by mixing silane(s) with a metal oxide, a second catalyst, and a third solvent; forming a combined sol by mixing the metal oxide sol with the silica sol; casting the mixture by spin coating or the like to form a silica and metal oxide containing layer on a substrate; and curing and/or heat treating the layer. This layer may make up all or only part of an anti-reflection coating which may be used in a photovoltaic device or the like.

15 Claims, 1 Drawing Sheet

U.S. PATENT DOCUMENTS

| | | | |
|---|---|---|---|
| 5,699,035 | A | 12/1997 | Ito et al. |
| 5,858,077 | A | 1/1999 | Kayanoki |
| 5,883,030 | A | 3/1999 | Bako et al. |
| 5,948,131 | A | 9/1999 | Neuman |
| 5,964,962 | A | 10/1999 | Sannomiya et al. |
| 5,977,477 | A | 11/1999 | Shiozaki |
| 5,985,364 | A | 11/1999 | Smith et al. |
| 6,123,824 | A | 9/2000 | Sano et al. |
| 6,129,980 | A * | 10/2000 | Tsukada et al. ............... 428/327 |
| 6,177,131 | B1 | 1/2001 | Glaubitt et al. |
| 6,187,824 | B1 | 2/2001 | Swank |
| 6,288,325 | B1 | 9/2001 | Jansen et al. |
| 6,342,097 | B1 | 1/2002 | Terry et al. |
| 6,372,327 | B1 | 4/2002 | Burnham et al. |
| 6,403,509 | B2 | 6/2002 | Cochran et al. |
| 6,407,021 | B1 | 6/2002 | Kitayama et al. |
| 6,423,565 | B1 * | 7/2002 | Barth et al. ..................... 438/57 |
| 6,469,438 | B2 | 10/2002 | Fukuoka et al. |
| 6,495,482 | B1 | 12/2002 | de Sandro et al. |
| 6,498,118 | B1 | 12/2002 | Landa et al. |
| 6,503,860 | B1 | 1/2003 | Dickinson et al. |
| 6,506,622 | B1 | 1/2003 | Shiozaki |
| 6,521,558 | B2 | 2/2003 | Landa et al. |
| 6,573,207 | B2 | 6/2003 | Landa et al. |
| 6,576,349 | B2 | 6/2003 | Lingle et al. |
| 6,610,622 | B1 | 8/2003 | Landa et al. |
| 6,613,603 | B1 | 9/2003 | Sano |
| 6,627,322 | B2 | 9/2003 | Choi et al. |
| 6,716,780 | B2 | 4/2004 | Landa et al. |
| 6,723,211 | B2 | 4/2004 | Lingle et al. |
| 6,749,941 | B2 | 6/2004 | Lingle |
| 6,776,007 | B2 | 8/2004 | Hirota et al. |
| 6,784,361 | B2 | 8/2004 | Carlson et al. |
| 6,787,005 | B2 | 9/2004 | Laird et al. |
| 6,796,146 | B2 | 9/2004 | Burnham |
| 6,844,210 | B2 | 1/2005 | Fukuoka et al. |
| 6,846,760 | B2 | 1/2005 | Siebers et al. |
| 6,887,575 | B2 | 5/2005 | Neuman et al. |
| 6,933,672 | B2 | 8/2005 | Hosokawa |
| 6,936,347 | B2 | 8/2005 | Laird et al. |
| 6,963,168 | B2 | 11/2005 | Eida et al. |
| 6,963,383 | B2 | 11/2005 | Tokailin et al. |
| 6,972,750 | B2 | 12/2005 | Yu |
| 6,979,414 | B2 | 12/2005 | Hosokawa |
| 6,987,547 | B2 | 1/2006 | Yang et al. |
| 6,989,280 | B2 | 1/2006 | Ko |
| 7,083,851 | B2 | 8/2006 | Faris |
| 7,132,666 | B2 | 11/2006 | Nakata et al. |
| 7,153,579 | B2 | 12/2006 | Kriltz et al. |
| 7,700,869 | B2 | 4/2010 | Thomsen et al. |
| 7,700,870 | B2 | 4/2010 | Thomsen et al. |
| 7,768,589 | B2 | 8/2010 | Miyachi et al. |
| 2001/0031811 | A1 | 10/2001 | Li et al. |
| 2002/0090519 | A1 | 7/2002 | Kursawe et al. |
| 2003/0008155 | A1 | 1/2003 | Hayashi et al. |
| 2004/0028918 | A1 | 2/2004 | Becker et al. |
| 2004/0058079 | A1 | 3/2004 | Yamada et al. |
| 2004/0121896 | A1 | 6/2004 | Landa et al. |
| 2004/0209757 | A1 | 10/2004 | Landa et al. |
| 2004/0248995 | A1 | 12/2004 | Glaubitt et al. |
| 2004/0258611 | A1 | 12/2004 | Barrow et al. |
| 2004/0258929 | A1 | 12/2004 | Glaubitt et al. |
| 2005/0109238 | A1 * | 5/2005 | Yamaki et al. ........... 106/287.16 |
| 2005/0142350 | A1 | 6/2005 | Douce et al. |
| 2005/0154086 | A1 | 7/2005 | Yoneyama |
| 2005/0195486 | A1 | 9/2005 | Sasaki et al. |
| 2005/0196617 | A1 | 9/2005 | King |
| 2005/0221079 | A1 * | 10/2005 | Shirakawa et al. ........... 428/332 |
| 2006/0019114 | A1 | 1/2006 | Thies et al. |
| 2006/0083936 | A1 | 4/2006 | Higuchi et al. |
| 2006/0099407 | A1 | 5/2006 | Wang et al. |
| 2007/0044295 | A1 | 3/2007 | Chen |
| 2008/0185041 | A1 | 8/2008 | Sharma et al. |

FOREIGN PATENT DOCUMENTS

| | | |
|---|---|---|
| EP | 1 329 433 | 7/2003 |
| EP | 1 447 433 | 8/2004 |
| JP | 62-179165 | 8/1987 |
| JP | 62-247574 | 10/1987 |
| JP | 07-122764 | 5/1995 |
| JP | 08-122501 | 5/1996 |
| JP | 11-60269 | 3/1999 |
| WO | WO 00/64992 | 11/2000 |

OTHER PUBLICATIONS

International Search Report dated Feb. 20, 2009.

"Method for the Preparation of Porous Silica Antireflection Coatings Varying in Refractive Index from 1.22 to 1.44", Thomas, Applied Optics, vol. 31, No. 28, Oct. 1, 1992.

Sakka, Sumio, Handbook of Sol-gel Science and Technology: Sol-gel processing, Springer 2005.

U.S. Appl. No. 11/701,541, filed Feb. 2, 2007; Sharma et al.

"Colored Glasses" Weyl; The Society of Glass Technology 1951, (4pgs).

"Colour Generation and Control in Glass", Bamford, Glass Science and Technology , 2, 1977 (3pgs).

"Photovoltaic Module Performance and Durability Following Long-Term Field Exposure", King et al., Sandia National Laboratories, (19pgs).

"Antireflection of Glazings for Solar Energy Applications", Nostell et al., Solar Energy Materials and Solar Cells 54 (1988) pp. 223-233.

"Anti-reflection (AR) Coatings Made by Sol-Gel Process: A Review", Chen, Solar Energy Materials and Solar Cells 68 (2001) pp. 313-336.

"Silica Antireflective Films on Glass Produced by the Sol-Gel Method", Bautista et al., Solar Energy Materials and Solar Cells 80 (2003) pp. 217-225.

Yoldas, B.E., O'Keeffe, T.W. "Antireflective coatings applied from metal-organic derived liquid precursors" Applied Optics, vol. 18, No. 18, Sep. 15, 1979.

* cited by examiner

PHOTOVOLTAIC DEVICE WITH SCRATCH-RESISTANT COATING

This application is a divisional of Application Ser. No. 11/716,034, filed Mar. 9, 2007, now U.S. Pat. No. 7,767,253 the entire disclosure of which is hereby incorporated herein by reference in this application.

This invention relates to a method of making an antireflective (AR) coating supported by a glass substrate for use in a photovoltaic device or the like. The AR coating includes, in certain exemplary embodiments, metal oxide(s) and porous silica, which may be produced using a sol-gel process. The AR coating may, for example, be deposited on glass used as a superstrate for the production of photovoltaic devices, although it also may used in other applications.

BACKGROUND OF THE INVENTION

Glass is desirable for numerous properties and applications, including optical clarity and overall visual appearance. For some example applications, certain optical properties (e.g., light transmission, reflection and/or absorption) are desired to be optimized. For example, in certain example instances, reduction of light reflection from the surface of a glass substrate may be desirable for storefront windows, display cases, photovoltaic devices such as solar cells, picture frames, other types of windows, and so forth.

Photovoltaic devices such as solar cells (and modules therefor) are known in the art. Glass is an integral part of most common commercial photovoltaic modules, including both crystalline and thin film types. A solar cell/module may include, for example, a photoelectric transfer film made up of one or more layers located between a pair of substrates. One or more of the substrates may be of glass, and the photoelectric transfer film (typically semiconductor) is for converting solar energy to electricity. Example solar cells are disclosed in U.S. Pat. Nos. 4,510,344, 4,806,436, 6,506,622, 5,977,477, and JP 07-122764, the disclosures of which are hereby incorporated herein by reference.

Substrate(s) in a solar cell/module are sometimes made of glass. Incoming radiation passes through the incident glass substrate of the solar cell before reaching the active layer(s) (e.g., photoelectric transfer film such as a semiconductor) of the solar cell. Radiation that is reflected by the incident glass substrate does not make its way into the active layer(s) of the solar cell, thereby resulting in a less efficient solar cell. In other words, it would be desirable to decrease the amount of radiation that is reflected by the incident substrate, thereby increasing the amount of radiation that makes its way to the active layer(s) of the solar cell. In particular, the power output of a solar cell or photovoltaic (PV) module may be dependant upon the amount of light, or number of photons, within a specific range of the solar spectrum that pass through the incident glass substrate and reach the photovoltaic semiconductor.

Because the power output of the module may depend upon the amount of light within the solar spectrum that passes through the glass and reaches the PV semiconductor, certain attempts have been made in an attempt to boost overall solar transmission through glass used in PV modules. One attempt is the use of iron-free or "clear" glass, which may increase the amount of solar light transmission when compared to regular float glass, through absorption minimization.

In certain example embodiments of this invention, an attempt to address the aforesaid problem(s) is made using an antireflective (AR) coating on a glass substrate (the AR coating may be provided on either side of the glass substrate in different embodiments of this invention). An AR coating may increase transmission of light through the substrate so that additional light reaches the semiconductor absorber film of the PV device. Thus, the power of a PV module can be improved in certain example embodiments of this invention.

It is known to use porous silica as AR coating on a glass substrate. But an AR coatings made solely from porous silica may be ineffective with respect to scratch resistance in certain instances. Such a low scratch resistance may be caused by the presence of pores, especially a large number of pores, in the AR coating. There may be a need to increase the scratch resistant property of AR coatings at any given transmission for high performance AR coatings that can be used as a PV superstrate.

Thus, it will be appreciated that there may exist a need for an improved AR coating, for solar cells or other applications, to reduce reflection off glass and other substrates.

BRIEF SUMMARY OF EXAMPLE EMBODIMENTS OF THE INVENTION

Certain example embodiments of this invention relate, in part, to the formulation and manufacture of AR coatings produced using a sol-gel process, which are based on porous silica containing metal oxide(s), for use in connection with glass intended to be used as a substrate in a photovoltaic device or the like. These porous silica coatings may have high transmittance, thereby improving the efficiency and/or power of the photovoltaic device in certain example embodiments. These coatings may also have improved scratch resistance.

In certain example embodiments of this invention, there is provided a method of making an anti-reflection coating for use in a photovoltaic device or the like, the method comprising: forming a polymeric component of silica by mixing at least a silane with one or more of a first solvent, a catalyst, and water; forming a sol gel by mixing the polymeric component with a colloidal silica, and optionally a second solvent; forming a metal oxide sol by mixing a silane with a metal oxide, a catalyst, water, optionally a complex agent, and optionally a third solvent; mixing the silica sol with the metal oxide sol; casting the mixture by spin coating to form a layer on a glass substrate; and curing and/or heat treating the layer, the layer making up at least part of the anti-reflecting (AR) coating.

The metal oxide(s) used in making the porous silica based layer (e.g., see layer 3a in the figures) are advantageous in that they may permit the resulting scratch resistance of the final layer 3a to be greater or increased. These metal oxide(s) may allow the materials of the porous silica based layer to react in order to increase the hardness of the resulting layer, which is advantageous.

In certain exemplary embodiments of this invention, there is provided a method of making an anti-reflection coating using a sol-gel process including: forming a polymeric component of silica by mixing glycycloxypropyltrimethoxysilane with a first solvent, a first catalyst, and water; forming a silica sol gel by mixing the polymeric component with a colloidal silica and a second solvent; forming a metal oxide sol by mixing at least glycycloxypropyltrimethoxysilane with a metal oxide, a second catalyst, and a third solvent; forming a combined sol gel by mixing the silica sol with the metal oxide sol; casting the combined sol gel by spin coating to form a coating on a substrate; and curing or heat treating the coating.

In certain exemplary embodiments, there is a method of making a coating for deposition on a substrate including: forming a combined sol gel by mixing a silane with a solvent, a catalyst, water, a colloidal silica, and a metal oxide; casting the combined sol gel by spin coating to form a layer on the substrate; and curing or heat treating the layer.

In certain exemplary embodiments, there is a photovoltaic device including a photovoltaic film, and at least a glass substrate on a light incident side of the photovoltaic film; an anti-reflection coating provided on the glass substrate; wherein the anti-reflection coating comprises at least a layer provided directly on and contacting the glass substrate, wherein the layer comprises a metal oxide. Optionally, the glass substrate comprises a soda-lime-silica glass including the following ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight. Optionally, the layer provided directly on and contacting the glass substrate comprises porous silica and/or $3Al_2O_3:2SiO_2$, $Al_2O_3$: $SiO_2$, $MgAl_2O_4$, $ZrO_2$, $Al_2O_3$, or $CaAl_2Si_2O_8$.

DETAILED DESCRIPTION OF EXEMPLARY EMBODIMENTS OF THE INVENTION

Figure 1:
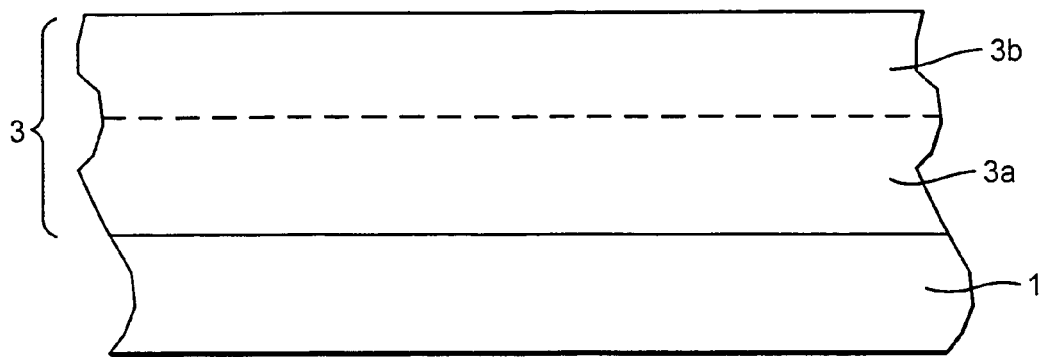
FIG. 1 is a cross-sectional view of a coated article including an antireflective (AR) coating made in accordance with an example embodiment of this invention (this coated article of FIG. 1 may be used in connection with a photovoltaic device or in any other suitable application in different embodiments of this invention).

Referring now more particularly to the accompanying drawings in which like reference numerals indicate like parts throughout the several views.

This invention relates to antireflective (AR) coatings provided for coated articles that may be used in devices such as photovoltaic devices, storefront windows, display cases, picture frames, other types of windows, and the like. In certain example embodiments (e.g., in photovoltaic devices), the AR coating may be provided on either the light incident side or the other side of the substrate (e.g., glass substrate).

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si layers, the semiconductor sometimes being called an absorbing layer or film) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

In certain example embodiments, single junction amorphous silicon (a-Si) photovoltaic devices include three semiconductor layers. In particular, a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention are directed toward amorphous-silicon based photovoltaic devices, this invention is not so limited and may be used in conjunction with other types of photovoltaic devices in certain instances including but not limited to devices including other types of semiconductor material, single or tandem thin-film solar cells, CdS and/or CdTe photovoltaic devices, polysilicon and/or microcrystalline Si photovoltaic devices, and the like.

In certain example embodiments of this invention, an improved AR coating is provided on an incident glass substrate of a photovoltaic device such as a solar cell or the like. This AR coating may function to reduce reflection of light from the glass substrate, thereby allowing more light within the solar spectrum to pass through the incident glass substrate and reach the photovoltaic semiconductor film so that the device can be more efficient. In other example embodiments of this invention, such an AR coating is used in applications other than photovoltaic devices, such as in storefront windows, display cases, picture frames, other types of windows, and the like. The glass substrate may be a glass superstrate or any other type of glass substrate in different instances.

FIG. 1 is a cross sectional view of a coated article according to an example embodiment of this invention. The coated article of FIG. 1 includes a glass substrate 1 and an AR coating 3. The AR coating includes a first layer 3a and an optional overcoat layer 3b.

In the FIG. 1 embodiment, the antireflective coating 3 includes first layer 3a of or including porous silica, which is produced using the sol-gel process including metal oxide(s). These metal oxides may, for example, be selected from metal oxides having a refractive index lower than about 2.0 (such as, for example: aluminum oxides like mullite, sillimanite, and alumina; magnesium-aluminum oxides like spinel; zirconium oxides like zirconia; calcium-aluminum oxides like anorthrite). The first layer 3a may be any suitable thickness in certain example embodiments of this invention.

Optionally, the AR coating 3 may also include an overcoat 3b of or including material such as silicon oxide (e.g., $SiO_2$), or the like, which may be provided over the first layer 3a in certain example embodiments of this invention as shown in FIG. 1. The overcoat layer 3b may be deposited over layer 3a in any suitable manner. For example, a Si or SiAl target could be sputtered in an oxygen and argon atmosphere to sputter-deposit the silicon oxide inclusive layer 3b. Alternatively, the silicon oxide inclusive layer 3b could be deposited by flame pyrolysis, or any other suitable technique such as spraying, roll coating, printing, via silica precursor sol-gel solution (then drying and curing), coating with a silica dispersion of nano or colloidal particles, vapor phase deposition, and so forth. It is noted that it is possible to form other layer(s) over overcoat layer 3b in certain example instances. It is also possible to form other layer(s) between layers 3a and 3b, and/or between glass substrate 1 and layer 3a, in different example embodiments of this invention.

It is noted that layer 3a and/or 3b may be doped with other materials such as titanium, aluminum, nitrogen or the like.

In certain example embodiments of this invention, high transmission low-iron glass may be used for glass substrate 1 in order to further increase the transmission of radiation (e.g., photons) to the active layer(s) of the solar cell or the like. For example and without limitation, the glass substrate 1 may be of any of the glasses described in any of U.S. patent application Ser. Nos. 11/049,292 and/or 11/122,218, the disclosures of which are hereby incorporated herein by reference. Furthermore, additional suitable glasses include, for example (i.e., and without limitation): standard clear glass; and/or low-iron glass, such as Guardian's ExtraClear, UltraWhite, or Solar. No matter the composition of the glass substrate, certain embodiments of anti-reflective coatings produced in accordance with the present invention may increase transmission of light to the active semiconductor film 5 (one or more layers) of the photovoltaic device and/or have a desirable or improved resistivity to scratching.

Certain glasses for glass substrate 1 (which or may not be patterned in different instances) according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight.

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO, by weight.

In addition to the base glass above, in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., cerium, erbium and/or the like). In certain example embodiments of this invention, the resulting glass has visible transmission of at least 75%, more preferably at least 80%, even more preferably of at least 85%, and most preferably of at least about 90% (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table 1 below (in terms of weight percentage of the total glass composition):

TABLE 1

Example Additional Materials In Glass

| Ingredient | General (Wt. %) | More Preferred | Most Preferred |
|---|---|---|---|
| total iron (expressed as $Fe_2O_3$): | 0.001-0.06% | 0.005-0.04% | 0.01-0.03% |
| cerium oxide: | 0-0.30% | 0.01-0.12% | 0.01-0.07% |
| $TiO_2$ | 0-1.0% | 0.005-0.1% | 0.01-0.04% |
| Erbium oxide: | 0.05 to 0.5% | 0.1 to 0.5% | 0.1 to 0.35% |

In certain example embodiments, the total iron content of the glass is more preferably from 0.01 to 0.06%, more preferably from 0.01 to 0.04%, and most preferably from 0.01 to 0.03%. In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material. It is noted that while the presence of cerium oxide is preferred in many embodiments of this invention, it is not required in all embodiments and indeed is intentionally omitted in many instances. However, in certain example embodiments of this invention, small amounts of erbium oxide may be added to the glass in the colorant portion (e.g., from about 0.1 to 0.5% erbium oxide).

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

It is noted that the light-incident surface of the glass substrate 1 may be flat or patterned in different example embodiments of this invention.

Figure 2:
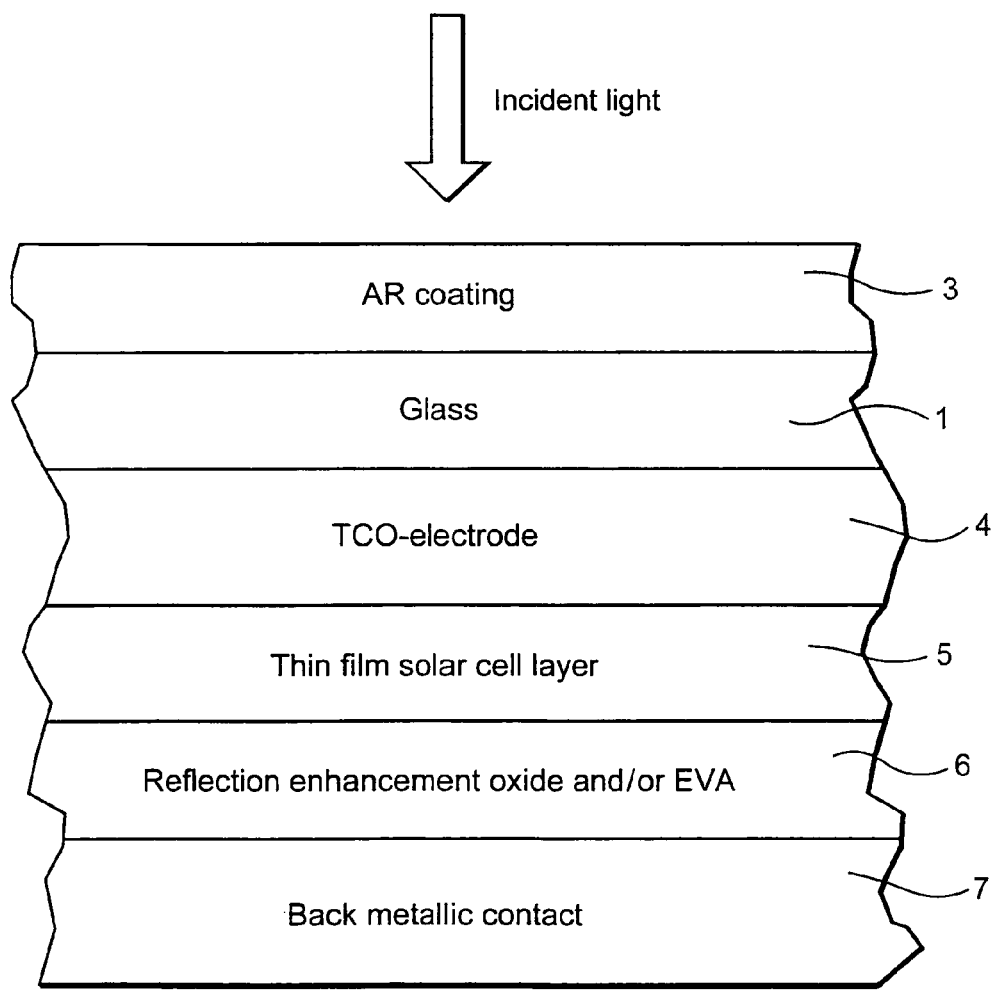
FIG. 2 is a cross-sectional view of a photovoltaic device that may use the AR coating of FIG. 1.

FIG. 2 is a cross-sectional view of a photovoltaic device (e.g., solar cell), for converting light to electricity, according to an example embodiment of this invention. The solar cell of FIG. 2 uses the AR coating 3 and glass substrate 1 shown in FIG. 1 in certain example embodiments of this invention. In this example embodiment, the incoming or incident light from the sun or the like is first incident on optional layer 3b of the AR coating 3, passes therethrough and then through layer 3a and through glass substrate 1 and front transparent conductive electrode 4 before reaching the photovoltaic semiconductor (active film) 5 of the solar cell. Note that the solar cell may also include, but does not require, a reflection enhancement oxide and/or EVA film 6, and/or a back metallic or otherwise conductive contact and/or reflector 7 as shown in example FIG. 2. Other types of photovoltaic devices may of course be used, and the FIG. 2 device is merely provided for purposes of example and understanding. As explained above, the AR coating 3 may reduce reflections of the incident light and permits more light to reach the thin film semiconductor film 5 of the photovoltaic device thereby permitting the device to act more efficiently.

While certain of the AR coatings 3 discussed above are used in the context of the photovoltaic devices/modules, this invention is not so limited. AR coatings 3 (which may include just 3a in certain instances) according to this invention may be used in other applications such as for picture frames, fireplace doors, and the like. Also, other layer(s) may be provided on the glass substrate under the AR coating so that the AR coating is considered on the glass substrate even if other layers are provided therebetween. Also, while the first layer 3a is directly on and contacting the glass substrate 1 in the FIG. 1 embodiment, it is possible to provide other layer(s) between the glass substrate and the first layer in alternative embodiments of this invention.

Set forth below is a description of how AR coating 3 may be made according to certain example non-limiting embodiments of this invention.

Exemplary embodiments of this invention provide a method of making a porous silica coating containing metal oxide(s) for use as the AR coating 3 (or 3a), with appropriate light transmission and abrasion or scratch resistance properties. In certain example embodiments of this invention, the coating solution may be based on a mixture of at least two sols. The first sol, which is a silica sol, may be based on two different silica precursors, namely (a) a colloidal silica solution including or consisting essentially of particulate silica in a solvent, and (b) a polymeric solution including or consisting essentially of silica chains. The second sol, which is or includes a metal oxide sol, may be a polymeric solution containing silica chains as well as a metal oxide, a silane.

In making the polymeric silica solution for the silica sol, a silane may be mixed with a catalyst, solvent and water. After agitating, the colloidal silica solution (a) is added to the polymeric silica solution (b), optionally with a solvent. In making the metal oxide sol, a silane is mixed with a metal oxide, a catalyst, and optionally a complex agent, optionally with a solvent. After agitating the metal oxide sol, it is mixed, combined, and/or agitated with the silica sol. The weight percentage of the metal oxide sol in the combined sol gel may ranges preferably from greater than 0 to 15% wt, and all subranges therebetween, more preferably 0.1 to 10% wt, and all subranges therebetween, more preferably 1 to 5% wt, and all subranges therebetween, and most preferably about 2% wt. In other alternative embodiments, greater than 15% wt of the metal oxide sol may be used.

The combined sol gel coating solution is then deposited on a suitable substrate such as a highly transmissive clear glass substrate, directly or indirectly. Then, the sol gel coating solution on the glass 1 substrate is cured and/or fired, preferably from about 100 to 750° C., and all subranges therebetween, thereby forming the solid AR coating 3 on the glass substrate 1. The final thickness of the AR coating 3 may, though not necessarily, be approximately a quarter wave thickness in certain example embodiments of this invention. It has been found that an AR coating made in such a manner may have adequate durability, thereby overcoming one or more of the aforesaid mechanical/abrasion resistance problems in approaches of the prior art.

In an exemplary embodiment, the sol-gel process used in forming coating 3 may comprise: forming a polymeric component of silica by mixing glycycloxypropyltrimethoxysilane (which is sometimes referred to as "glymo") with a first solvent, a catalyst, and water; forming a silica sol gel by mixing the polymeric component with a colloidal silica, a second solvent; forming a metal oxide sol by mixing glymo with a metal oxide, a catalyst, water, optionally a complex agent, and a solvent; mixing the silica sol with the metal oxide sol; casting the mixture by spin coating to form a coating on the glass substrate; and curing and heat treating the coating. Suitable solvents may include, for example, n-propanol, isopropanol, other well-known alcohols (e.g., ethanol), and other well-known organic solvents (e.g., toluene). Suitable catalysts may include, for example, well-known acids, such as hydrochloric acid, sulfuric acid, etc. The colloidal silica may comprise, for example, silica and methyl ethyl ketone. Suitable complex agents may, for example include acetylacetate, N-methylpyrrolidone, N,N-dimethyl formamide, N,N dimethyl acrylamide, triethanolamine (TEA), diethanolamine, polyvinylpyrolidone (PVP), citric acid, etc. The mixing of the silica sol and the metal oxide sol may occur at or near room temperature for 15 to 45 minutes (and preferably around 30 minutes) or any other period sufficient to mix the two sols either homogeneously or nonhomogeneously. The curing may occur at a temperature between 100 and 150° C. for up to 2 minutes, and the heat treating may occur at a temperature between 600 and 750° C. for up to 5 minutes. Shorter and longer times with higher and lower temperatures are contemplated within exemplary embodiments of the present invention.

In alternative embodiments, two or more metal sols are mixed with the silica sol to form a combined sol gel. In further embodiments, additional ingredients, such as organic compounds, may be mixed in during the formation of any of the metal oxide or silica sols, such as described in a co-pending U.S. patent application currently assigned Atty. Dkt. No. 3691-1169, filed Feb. 2, 2007.

The following examples illustrate exemplary, nonlimiting, embodiments of the present invention.

Preparation of Silica Sol:

The silica sol was prepared as follows. A polymeric component of silica was prepared by using 64% wt n-propanol, 24% wt Glycycloxylpropyltrimethoxysilane (Glymo), 7% wt water, and 5% wt hydrochloric acid. These ingredients were mixed for 24 hrs. The coating solution was prepared by using 21% wt polymeric solution, 7% wt colloidal silica in methyl ethyl ketone supplied by Nissan Chemicals Inc, and 72% wt n-propanol. This was stirred for 2 hrs to give silica sol. The final solution is referred to as silica sol. While glycycloxypropyltrimethoxysilane is an example silane that is used, other silane(s) may instead be used in different embodiments of this invention.

Preparation of Mullite ($3Al_2O_3:2SiO_2$) Sol:

Mullite sol containing 3 parts alumina and 2 parts silica was prepared by taking 2.18 gm aluminum tert butoxide and 0.73 gm Glycycloxylpropyltrimethoxysilane (Glymo) in a solution containing 6 gm acetylacetate, 6 gm hydrochloric acid, and 20 gm n-propanol. This solution was stirred for 15 minutes. Then 0.5 gm water was added. The solution was stirred for another 15 minutes. The final solution is referred to as $3Al_2O_3:2SiO_2$ sol.

Preparation of Sillimanite ($Al_2O_3:SiO_2$) Sol:

Sillimanite sol containing 1 part alumina and 1 part silica was prepared by taking 2.45 gm aluminum tert butoxide and 1.15 gm Glycycloxylpropyltrimethoxysilane (Glymo) in a solution containing 2 gm acetylacetate, 6 gm hydrochloric acid, and 20 gm n-propanol. This solution was stirred for 15 minutes. Then 0.5 gm water was added. The solution was stirred for another 15 minutes. The final solution is referred to as $Al_2O_3: SiO_2$ sol.

Preparation of Spinel (Mg $Al_2O_4$) Sol:

Spinel sol containing 1 part magnesia (MgO) and 1 part alumina was prepared by taking 2.5 gm aluminum tert butoxide and 1.07 gm magnesium acetate in a solution containing 2 gm acetylacetate, 6 gm hydrochloric acid, and 20 gm n-propanol. This solution was stirred for 15 minutes. Then 0.5 gm water was added. The solution was stirred for another 15 minutes. The final solution is referred to as Mg $Al_2O_4$ sol.

Preparation of Alumina ($Al_2O_3$) Sol:

2.52 gm aluminum tert butoxide was mixed in a solution containing 2 gm acetylacetate, 6 gm hydrochloric acid, and 20 gm n-propanol. This solution was stirred for 15 minutes. Then 0.5 gm water was added. The solution was stirred for another 15 minutes. The final solution is referred to as $Al_2O_3$ sol.

Preparation of Zirconia ($ZrO_2$) Sol:

3.8 gm of zirconium butoxide was mixed in a solution containing 2 gm acetylacetate, 6 gm hydrochloric acid, 2 gm nitric acid, and 20 gm n-propanol. This solution was stirred for 15 minutes. Then 0.5 gm water was added. The solution was stirred for another 15 minutes. The final solution is referred to as $ZrO_2$ sol.

Preparation of Anorthrite ($CaAl_2Si_2O_8$) Sol:

Anorthrite sol containing 1 part alumina, 2 parts silica and 1 part calcium oxide, was prepared by taking 2.5 gm aluminum tert butoxide, 2.3 gm Glycycloxylpropyltrimethoxysilane (Glymo) and 0.8 gm calcium acetate in a solution containing 2 gm acetylacetate, 6 gm hydrochloric acid, and 20 gm n-propanol. This solution was stirred for 15 minutes. Then 0.5 gm water was added. The solution was stirred for another 15 minutes. The final solution is referred to as $CaAl_2Si_2O_8$ sol.

Measurement of Scratch Resistance:

Scratch resistance of the coatings was tested using the Micro-Tribometer manufactured by CETR (Center for Tribology) using pre-cleaned borosilicate glass (BSG) media with nominally 3.2 mm diameter. The applied coating under test was also cleaned using isopropanol and wiped gently by soft Shurwipes prior to testing. Constant load mode was selected to evaluate the AR coatings.

The loading process is described as follows. The BSG media is inserted into a media holder which is attached to a load sensor (in our case, we used 50 gm or nearly 500 mN load sensor). The carriage holding the load sensor was allowed (as per our pre-programmed instruction) to travel downward to allow landing the media onto the specimen surface at a pre-determined load (in our case, it was between 20-130 mN), followed by a pre-determined speed of travel (in our case it was 30 mm in 60 secs) of the specimen stage. Each scratch process was followed by visual and microscopic examination of the coating surface to look for scratch damage. The process was repeated a few times for each coating. The load at which the scratch becomes visible is defined a critical scratch load.

EXAMPLE #1

The silica coating was fabricated using spin coating method with 1000 rpm for 18 secs. The coating was heat treated in furnace at 625° C. for three and a half minutes. The critical scratch load of this coating is 30 mN as shown in the table 2.

EXAMPLE #2

The example #2 is same as example #1 except $3Al_2O_3$: $2SiO_2$ sol and silica sol were taken in 2:98 percent weight ratio respectively and mixed for 30 mins at room temperature prior to spin coating. The critical scratch load of this coating is 50 mN as shown in the table 2.

EXAMPLE #3

The example #3 is same as example #2 except the $Al_2O_3$: $SiO_2$ sol and silica sol were taken in 2:98 percent weight ratio respectively. The critical scratch load of this coating is 70 mN as shown in the table 2.

EXAMPLE #4

The example #4 is same as example #2 except the Mg $Al_2O_4$ sol and silica sol were taken in 2:98 percent weight ratio respectively. The critical scratch load of this coating is 40 mN as shown in the table 2.

EXAMPLE #5

The example #5 is same as example #2 except the $ZrO_2$ sol and silica sol were taken in 2:98 percent weight ratio respectively. The critical scratch load of this coating is 80 mN as shown in the table 2.

EXAMPLE #6

The example #6 is same as example #2 except the $Al_2O_3$ sol and silica sol were taken in 2:98 percent weight ratio respectively. The critical scratch load of this coating is 70 mN as shown in the table 2.

EXAMPLE #7

The example #7 is same as example #2 except the $CaAl_2Si_2O_8$ sol and silica sol were taken in 2:98 percent weight ratio respectively. The critical scratch load of this coating is 100 mN as shown in the table 2.

TABLE 2

Coating of derived from porous silica and additives

| Example No. | Metal oxide sol (% wt) | Silica sol (% wt) | Scratch invisible by eyes (CRL) |
|---|---|---|---|
| Example #1 | None | 100 | 30 mN |
| Example #2 | $3Al_2O_3:2SiO_2$ | 98 | 50 mN |
| Example #3 | $Al_2O_3:SiO_2$ | 98 | 70 mN |
| Example #4 | $Mg\ Al_2O_4$ | 98 | 40 mN |
| Example #5 | $ZrO_2$ | 98 | 80 mN |
| Example #6 | $Al_2O_3$ | 98 | 70 mN |
| Example #7 | $CaAl_2Si_2O_8$ | 98 | 100 mN |

Table 2 illustrates that approximately 40-70 mN critical scratch load can be obtained using mullite, silimanite and spinels; approximately 70-80 mN (or 60-90 nM) critical scratch load can be obtained using alumina and zirconia; and approximately 100 mN (e.g., from about 80-120 mN) critical scratch load can be obtained using tri-metal oxides such as anorthrite.

All numerical ranges and amounts are approximate and include at least some variation.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A photovoltaic device comprising:
a photovoltaic film, and at least a glass substrate on a light incident side of the photovoltaic film;
an anti-reflection coating provided on the glass substrate;
wherein the anti-reflection coating comprises at least a layer provided directly on and contacting the glass substrate, wherein the layer comprises porous silica and a metal oxide and wherein the layer comprising porous silica and the metal oxide comprises less than 5% of the metal oxide by weight, and wherein the layer comprising porous silica and the metal oxide comprises anorthite.

2. The photovoltaic device of claim 1, wherein the glass substrate comprises a soda-lime-silica glass including the following ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1 5% by weight; and BaO, 0-1%, by weight.

3. The photovoltaic device of claim 1, wherein the metal oxide further comprises one or more of: $3Al_2O_3:2SiO_2$, $Al_2O_3: SiO_2$, $Mg Al_2O_4$, $ZrO_2$, and $Al_2O_3$.

4. The photovoltaic device of claim 1, wherein the anti-reflection coating further comprises a layer comprising an oxide of silicon located over and contacting the layer comprising porous silica and the metal oxide.

5. The photovoltaic device of claim 1, wherein the layer comprising porous silica and the metal oxide comprises a critical scratch load of from about 40 to 70 mN.

6. The photovoltaic device of claim 1, wherein the anti-reflection coating comprises a critical scratch load of from about 40 to 70 mN.

7. The photovoltaic device of claim 1, wherein the layer comprising porous silica and the metal oxide comprises a critical scratch load of from about 70 to 80 mN.

8. The photovoltaic device of claim 1, wherein the anti-reflection coating comprises a critical scratch load of from about 70 to 80 mN.

9. The photovoltaic device of claim 1, wherein the layer comprising porous silica and the metal oxide comprises a critical scratch load of from about 80 to 120 mN.

10. The photovoltaic device of claim 1, wherein the anti-reflection coating comprises a critical scratch load of from about 80 to 120 mN.

11. A photovoltaic device comprising:
a photovoltaic film, and at least a glass substrate on a light incident side of the photovoltaic film;
an anti-reflection coating provided on the glass substrate;
wherein the anti-reflection coating comprises a first layer comprising porous silica and a metal oxide provided directly on and contacting the glass substrate, wherein the first layer comprises anorthite; and
a second layer comprising an oxide of silica provided over and contacting the first layer, wherein the anti-reflection coating comprises a critical scratch load of from about 40 to 120 mN.

12. The photovoltaic device of claim 11, wherein the first layer further comprises mullite, silimanite, and/or spinels.

13. The photovoltaic device of claim 11, wherein the first layer comprises less than about 5% metal oxide by weight.

14. The photovoltaic device of claim 1, wherein the layer comprising porous silica and the metal oxide comprises about 2% metal oxide by weight.

15. The photovoltaic device of claim 13, wherein the first layer comprises about 2% metal oxide by weight.

* * * * *